(12) United States Patent
Iizuka et al.

(10) Patent No.: US 9,071,213 B2
(45) Date of Patent: Jun. 30, 2015

(54) BIAS CIRCUIT AND AMPLIFIER WITH CURRENT LIMIT FUNCTION

(71) Applicant: SAMSUNG ELECTRO-MECHANICS CO., LTD., Suwon, Gyunggi-do (KR)

(72) Inventors: Shinichi Iizuka, Gyunggi-do (KR); Young Jean Song, Gyunggi-do (KR); Ki Joong Kim, Gyunggi-do (KR); Myeong Woo Han, Gyunggi-do (KR); Ju Young Park, Gyunggi-do (KR); Youn Suk Kim, Gyunggi-do (KR); Jun Goo Won, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 61 days.

(21) Appl. No.: 13/939,050

(22) Filed: Jul. 10, 2013

(65) Prior Publication Data

US 2014/0232459 A1 Aug. 21, 2014

(30) Foreign Application Priority Data

Feb. 19, 2013 (KR) ........................ 10-2013-0017407

(51) Int. Cl.
*H03G 3/00* (2006.01)
*G05F 3/30* (2006.01)
*H03F 1/02* (2006.01)
*H03F 1/56* (2006.01)
*H03F 3/19* (2006.01)
*H03F 3/24* (2006.01)

(52) U.S. Cl.
CPC ................. *H03G 3/004* (2013.01); *G05F 3/30* (2013.01); *H03F 1/0222* (2013.01); *H03F 1/56* (2013.01); *H03F 3/19* (2013.01); *H03F 3/245* (2013.01); *H03F 2200/222* (2013.01); *H03F 2200/387* (2013.01); *H03F 2200/555* (2013.01)

(58) Field of Classification Search
USPC .................................. 330/285, 296–298, 289
See application file for complete search history.

(56) References Cited

U.S. PATENT DOCUMENTS

| 7,088,183 | B2 * | 8/2006 | Kuriyama ..................... 330/296 |
| 8,040,186 | B2 * | 10/2011 | Nakayama et al. ........... 330/285 |
| 2007/0236293 | A1 | 10/2007 | Masuda et al. |
| 2009/0212863 | A1 | 8/2009 | Ishimaru |

FOREIGN PATENT DOCUMENTS

| JP | 2007-306543 A | 11/2007 |
| JP | 2009-200770 A | 9/2009 |

* cited by examiner

*Primary Examiner* — Hieu Nguyen
(74) *Attorney, Agent, or Firm* — McDermott Will & Emery LLP

(57) ABSTRACT

There are provided a bias circuit and an amplifier having a current limit function, including: a control voltage generating unit generating a control voltage using a reference voltage; a bias voltage generating unit generating a bias voltage according to the control voltage; and a bias current limit unit controlling the control voltage according to a bias current of the bias voltage generating unit.

9 Claims, 4 Drawing Sheets

BIAS CIRCUIT AND AMPLIFIER WITH CURRENT LIMIT FUNCTION

CROSS-REFERENCE TO RELATED APPLICATIONS

This application claims the priority of Korean Patent Application No. 10-2013-0017407 filed on Feb. 19, 2013, in the Korean Intellectual Property Office, the disclosure of which is incorporated herein by reference.

BACKGROUND OF THE INVENTION

1. Field of the Invention

The present invention relates to a bias circuit and an amplifier that have a current limit function capable of limiting a bias current exceeding a normal range by varying a control voltage.

2. Description of the Related Art

In general, selecting a wireless communications scheme is a matter of selecting a digital modulation/demodulation scheme, and an appropriate scheme has been employed in consideration of frequency utilization efficiency. For instance, a quadrature phase shift keying (QPSK) scheme is employed for a mobile telephone using a code division multiple access (CDMA) scheme, and an orthogonal frequency division multiplexing (QFDM) scheme is employed in a wireless LAN conforming to the Institute of Electrical and Electronics Engineers (IEEE) 802.11 standards.

Wireless communications systems in which such wireless communications schemes are employed include power amplifiers for amplifying high frequency signals.

Here, in a system requiring linear amplification, a power amplifier having linear characteristics is required to amplify a transmission signal without distortion. Here, linear characteristics mean that the power of an output signal is amplified at a constant rate while the phase thereof is not changed, even in the case that the power of an input signal varies.

In addition, a technology which compensates for temperature so as to prevent a power amplification rate from significantly changing, even in the case that ambient temperature changes, is required.

In a typical power amplifier, a bias voltage generated by a bias circuit is supplied to a power amplifying element. The bias circuit may include a temperature compensation function.

However, a temperature compensation function in a typical power amplifier, performed by a transistor, may have limitations, such that bias current may increase due to an increase in temperature. In this case, the increased bias current may cause the temperature at the junction of the transistor included in a bias voltage generating unit to be increased, a so-called thermal runaway phenomenon.

Patent Document 1 relates to a power amplifier but does not disclose limiting a high bias current exceeding a normal range by varying a control voltage.

RELATED ART DOCUMENT (Patent Document 1) Japanese Patent Laid-Open Publication No. 2009-200770

SUMMARY OF THE INVENTION

An aspect of the present invention provides a bias circuit and an amplifier which have current limit functions to limit a bias current exceeding a normal range by varying a control voltage.

According to an aspect of the present invention, there is provided a bias circuit including: a control voltage generating unit generating a control voltage using a reference voltage; a bias voltage generating unit generating a bias voltage according to the control voltage; and a bias current limit unit controlling the control voltage according to a bias current of the bias voltage generating unit.

According to another aspect of the present invention, there is provided an amplifier including: a control voltage generating unit generating a control voltage using a reference voltage; a bias voltage generating unit generating a bias voltage according to the control voltage; a bias current limit unit controlling the control voltage according to a bias current of the bias voltage generating unit; and an amplifying unit receiving the bias voltage from the bias voltage generating unit to amplify a high frequency signal.

In the above aspects, the control voltage generating unit may include: a first temperature compensating transistor having a collector connected to a reference voltage input terminal via a first resistor, and an emitter and a base connected to a ground; and a second temperature compensating transistor having a collector connected to an operating voltage input terminal, a base connected to the collector of the first temperature compensating transistor, and an emitter connected to the ground via a second resistor, wherein the control voltage may be provided from the collector of the first temperature compensating transistor.

The bias voltage generating unit may include: a bias supply transistor having a collector connected to the operating voltage input terminal, a base connected to the collector of the first temperature compensating transistor, and an emitter connected to an output node of the bias voltage generating unit; and a capacitor connected between the base of the bias supply transistor and the ground.

The bias current limit unit may include: a current limit resistor reducing a voltage according to the bias current; and a current limit transistor operated by a voltage difference between the bias voltage and the voltage reduced by the current limit resistor and controlling current flowing through the second temperature compensating transistor.

Alternatively, the bias current limit unit may include: a current limit resistor having one end connected to an output node of the bias voltage generating unit and the other end; and a current limit transistor having a collector connected to the emitter of the second temperature compensating transistor, a base connected to the other end of the current limit resistor, and an emitter connected to the ground.

Here, the current limit transistor may be operated by a voltage difference between the bias voltage and a voltage reduced by the current limit resistor and control current flowing through the second temperature compensating transistor.

In another aspect of the present invention, the amplifying unit may include a power amplifier amplifying power of the high frequency signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
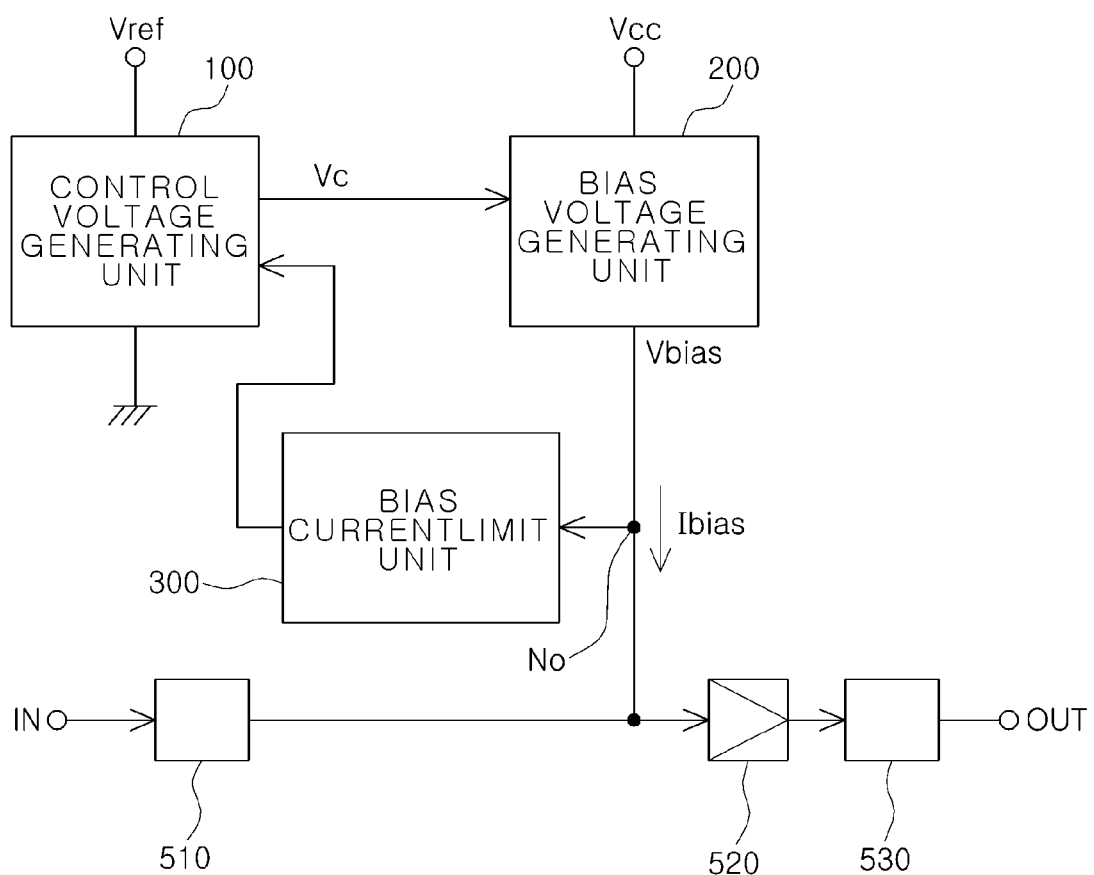
FIG. 1 is a block diagram of a bias circuit and an amplifier according to an embodiment of the invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

Throughout the drawings, the same or like reference numerals will be used to designate the same or like elements.

FIG. 1 is a circuit diagram of a bias circuit and an amplifier according to an embodiment of the invention.

Referring to FIG. 1, the bias circuit according to the present embodiment of the invention may include a control voltage generating unit 100, a bias voltage generating unit 200, and a bias current limit unit 300.

Further, the amplifier according to the present embodiment of the invention may include a control voltage generating unit 100, a bias voltage generating unit 200, a bias current limit unit 300 and an amplifying unit 520.

In addition, the amplifier according to the present embodiment of the invention may further include an input matching unit 510 connected to an input terminal of the amplifying unit 520, and an output matching unit 530 connected to an output terminal of the amplifying unit 520.

The control voltage generating unit 100 may generate a control voltage Vc using a reference voltage Vref. For example, when the reference voltage Vref is 2.9 V, the control voltage Vc may be 2.6 V.

The bias voltage generating unit 200 may generate a bias voltage Vbias according to the control voltage Vc. For example, if the control voltage Vc increases, the bias voltage Vbias also increases, and if the control voltage Vc decreases, the bias voltage Vbias also decreases.

The bias current limit unit 300 may limit an increase in a bias current Ibias by controlling the control voltage Vc according to the bias current Ibias of the bias voltage generating unit 200.

For example, if the bias current Ibias increases, the control voltage Vc is reduced so that the bias current may be limited.

Figure 2:
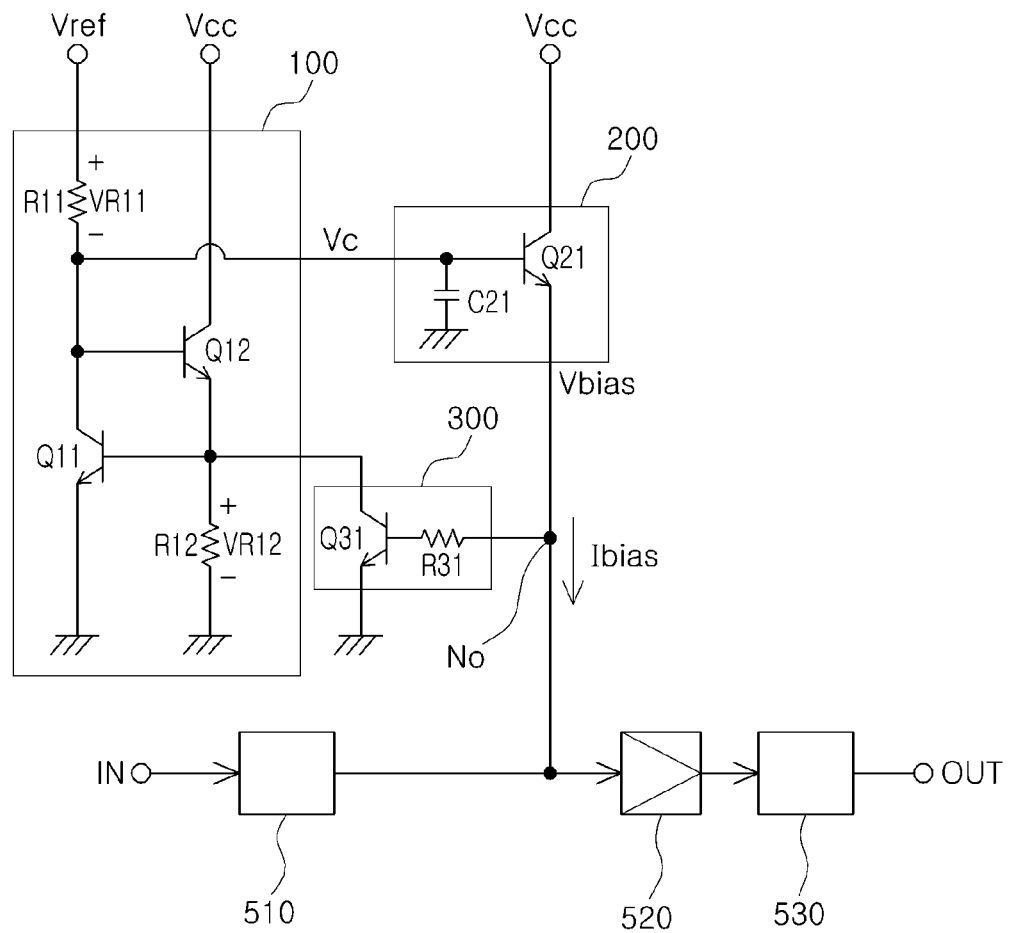
FIG. 2 is a circuit diagram specifically illustrating a bias circuit and an amplifier according to an embodiment of the invention.

FIG. 2 is a circuit diagram specifically illustrating a bias circuit and an amplifier according to an embodiment of the invention.

Referring to FIG. 2, the control voltage generating unit 100 may include a first temperature compensating transistor Q11 having a collector connected to a reference voltage Vref input terminal via a first resistor R11 and an emitter and a base connected to a ground, and a second temperature compensating transistor Q12 having a collector connected to an operating voltage Vcc input terminal, a base connected to the collector of the first temperature compensating transistor Q11 and an emitter connected to the ground via a second resistor R12.

Here, a base-emitter voltage Vbe1 of the first temperature compensating transistor Q11 is equal to a voltage VR12 across the second resistor R12, and a collector-base voltage Vcb1 of the first temperature compensating transistor Q11 is equal to a base-emitter voltage Vbe2 of the second temperature compensating transistor Q12.

Accordingly, the control voltage Vc output from the collector of the first temperature compensating transistor Q11 is equal to the sum of the collector-base voltage Vcb1 and the base-emitter voltage Vbe1 of the first temperature compensating transistor Q11, and to the sum of the base-emitter voltage Vbe2 and the voltage VR12 across the second resistor R12 of the second temperature compensating transistor Q12.

The bias voltage generating unit 200 may include a bias supply transistor Q21 having a collector connected to the operating voltage Vcc input terminal, a base connected to the collector of the first temperature compensating transistor Q11 and an emitter connected to an output node No of the bias voltage generating unit 200, and a capacitor C21 connected between the base of the bias supply transistor Q21 and the ground.

Here, the bias supply transistor Q21 may supply the bias voltage Vbias to the output node of the bias voltage generating unit 200 according to a stable voltage from which an alternating current (AC) component is removed by the capacitor C21.

In addition, the bias current limit unit 300 may include a current limit resistor R31 reducing a voltage according to the bias current Ibias, and a current limit transistor Q31 operated by a voltage difference between the bias voltage Vbias and the voltage VR31 reduced by the current limit resistor R31.

Here, the current limit resistor R31 may have one end connected to the output node No of the bias voltage generating unit 200, and the other end connected to the base of the current limit transistor Q31.

The current limit transistor Q31 may have a collector connected to the emitter of the second temperature compensating transistor Q12, a base connected to the other end of the current limit resistor R31, and an emitter connected to the ground.

The current limit transistor Q31 may be operated by the voltage difference between the bias voltage Vbias and the voltage VR31 reduced by the current limit resistor R31, to thereby control the current flowing through the second temperature compensating transistor Q12.

Then, the amplifying unit 520 may receive the bias voltage Vbias from the bias voltage generating unit 200 to amplify a high frequency signal.

Here, the input matching unit 510 performs impedance matching at the input terminal of the amplifying unit 520, such that an input signal IN input via the input terminal is transmitted to the amplifying unit 520 without loss. Likewise, the output matching unit 530 performs impedance matching at the output terminal of the amplifying unit 520, such that an output signal OUT is transmitted from the amplifying unit 520 to the output terminal without loss.

The bias current limit operations performed in the bias circuit and the amplifier according to the embodiments of the invention will be described with reference to FIGS. 3 and 4.

Figure 3:
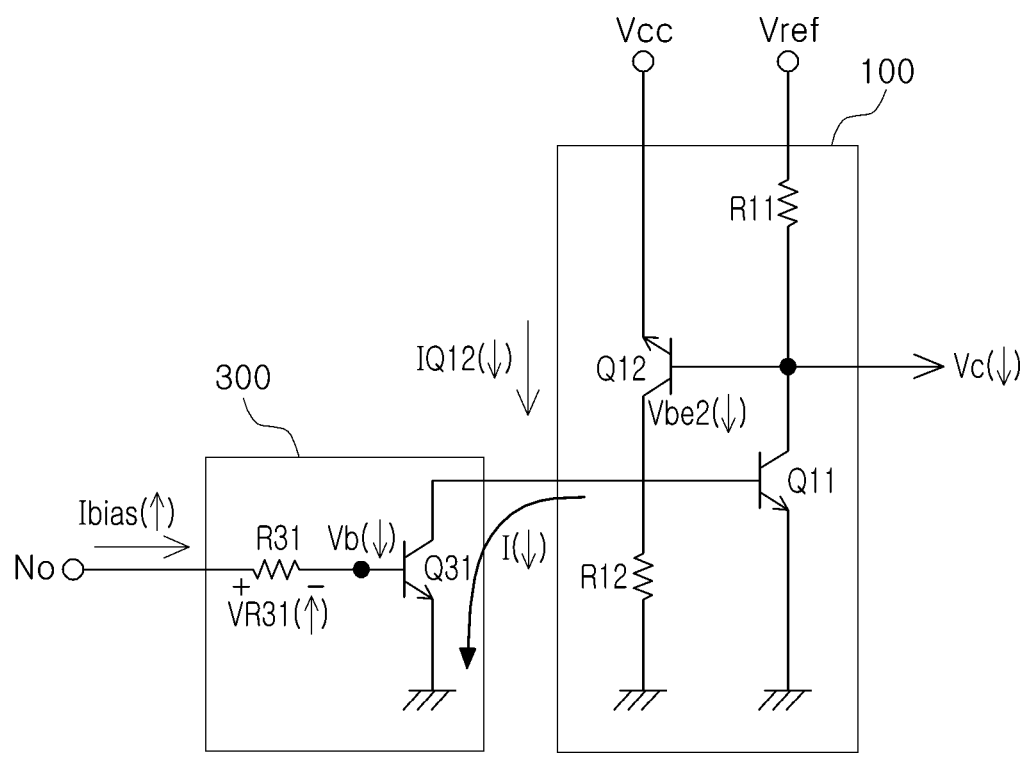
FIG. 3 is a circuit diagram illustrating a first operation of a bias circuit and an amplifier according to an embodiment of the invention.

FIG. 3 is a circuit diagram illustrating a first operation of a bias circuit and an amplifier according to an embodiment of the invention.

Referring to FIG. 3, the bias current Ibias is input to the bias current limit unit 300 via the output node No of the bias voltage generating unit 200.

If the bias current Ibias increases, the voltage drop VR31 across the current limit resistor R31 included in the bias current limit unit 300 increases. Accordingly, the base voltage Vb applied to the base of the current limit transistor Q31 decreases, and the current I flowing through the collector-emitter of the current limit transistor Q31 is reduced.

Further, the current flowing through the collector-emitter of the second temperature compensating transistor Q12 included in the bias voltage generating unit 200 is reduced.

Then, if the current flowing through the collector-emitter of the second temperature compensating transistor Q12 decreases, the base-emitter voltage Vbe2 of the second temperature compensating transistor Q12 is reduced, such that the control voltage Vc is reduced.

Then, if the control voltage Vc decreases, the bias current Ibias flowing through the collector-emitter of the bias supply transistor Q21 included in the bias voltage generating unit 200 is reduced.

Eventually, it can be seen that an increase in the bias current is limited by the bias current limit unit 300 when the bias current Ibias increases.

Figure 4:
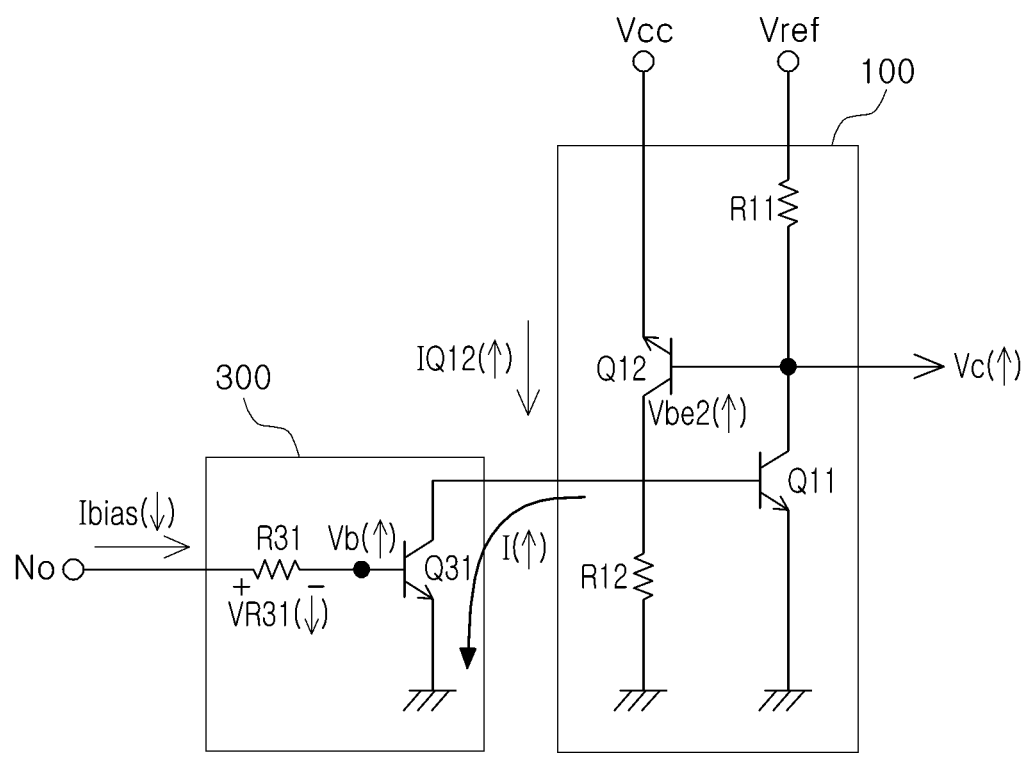
FIG. 4 is a circuit diagram illustrating a second operation of a bias circuit and an amplifier according to an embodiment of the invention.

FIG. 4 is a circuit diagram illustrating a second operation of a bias circuit and an amplifier according to an embodiment of the invention.

Referring to FIG. 4, as described above, the bias current Ibias is input to the bias current limit unit 300 via the output node No of the bias voltage generating unit 200.

If the bias current Ibias decreases, the voltage drop VR31 across the current limit resistor R31 included in the bias current limit unit 300 decreases. Accordingly, the base voltage Vb applied to the base of the current limit transistor Q31 increases, and the current I flowing through the collector-emitter of the current limit transistor Q31 is increased.

Further, the current flowing through the collector-emitter of the second temperature compensating transistor Q12 included in the bias voltage generating unit 200 is increased.

Then, if the current flowing through the collector-emitter of the second temperature compensating transistor Q12 increases, the base-emitter voltage Vbe2 of the second temperature compensating transistor Q12 is increased, such that the control voltage Vc is increased.

Then, if the control voltage Vc increases, the bias current Ibias flowing through the collector-emitter of the bias supply transistor Q21 included in the bias voltage generating unit 200 is increased.

Eventually, it can be seen that a decrease in the bias current Ibias is limited by the bias current limit unit 300 when the bias current Ibias decreases.

As set forth above, according to embodiments of the invention, in a bias circuit of an amplifier, a bias current exceeding a normal range can be limited by varying a control voltage and thereby preventing thermal runaway, so that the circuit and components thereof can be protected.

While the present invention has been shown and described in connection with the embodiments, it will be apparent to those skilled in the art that modifications and variations can be made without departing from the spirit and scope of the invention as defined by the appended claims.

What is claimed is:

1. A bias circuit comprising:
   a control voltage generating unit generating a control voltage using a reference voltage;
   a bias voltage generating unit generating a bias voltage according to the control voltage; and
   a bias current limit unit controlling the control voltage according to a bias current of the bias voltage generating unit to limit an increase in the bias current,
   wherein the control voltage generating unit includes:
      a first temperature compensating transistor having a collector connected to a reference voltage input terminal via a first resistor, and an emitter and a base connected to a ground; and
      a second temperature compensating transistor having a collector connected to an operating voltage input terminal, a base connected to the collector of the first temperature compensating transistor, and an emitter connected to the ground via a second resistor,
   wherein the control voltage is provided from the collector of the first temperature compensating transistor, and
   wherein the bias current limit unit includes:
      a current limit resistor reducing a voltage according to the bias current; and
      a current limit transistor operated by a voltage difference between the bias voltage and the voltage reduced by the current limit resistor and controlling current flowing through the second temperature compensating transistor.

2. The bias circuit of claim 1, wherein the bias voltage generating unit includes:
   a bias supply transistor having a collector connected to the operating voltage input terminal, a base connected to the collector of the first temperature compensating transistor, and an emitter connected to an output node of the bias voltage generating unit; and
   a capacitor connected between the base of the bias supply transistor and the ground.

3. A bias circuit comprising:
   a control voltage generating unit generating a control voltage using a reference voltage;
   a bias voltage generating unit generating a bias voltage according to the control voltage; and
   a bias current limit unit controlling the control voltage according to a bias current of the bias voltage generating unit to limit an increase in the bias current,
   wherein the control voltage generating unit includes:
      a first temperature compensating transistor having a collector connected to a reference voltage input terminal via a first resistor, and an emitter and a base connected to a ground; and
      a second temperature compensating transistor having a collector connected to an operating voltage input terminal, a base connected to the collector of the first temperature compensating transistor, and an emitter connected to the ground via a second resistor,
   wherein the control voltage is provided from the collector of the first temperature compensating transistor, and
   wherein the bias current limit unit includes:
      a current limit resistor having one end connected to an output node of the bias voltage generating unit and the other end; and
      a current limit transistor having a collector connected to the emitter of the second temperature compensating transistor, a base connected to the other end of the current limit resistor, and an emitter connected to the ground.

4. The bias circuit of claim 3, wherein the current limit transistor is operated by a voltage difference between the bias voltage and a voltage reduced by the current limit resistor, and controls current flowing through the second temperature compensating transistor.

5. An amplifier comprising:
   a control voltage generating unit generating a control voltage using a reference voltage;
   a bias voltage generating unit generating a bias voltage according to the control voltage;
   a bias current limit unit controlling the control voltage according to a bias current of the bias voltage generating unit; and an amplifying unit receiving the bias voltage from the bias voltage generating unit to amplify a high frequency signal, wherein the control voltage generating unit includes:
- a first temperature compensating transistor having a collector connected to a reference voltage input terminal via a first resistor, and an emitter and a base connected to a ground; and
- a second temperature compensating transistor having a collector connected to an operating voltage input terminal, a base connected to the collector of the first temperature compensating transistor, and an emitter connected to the ground via a second resistor, wherein the control voltage is provided from the collector of the first temperature compensating transistor, and wherein the bias current limit unit includes:
- a current limit resistor reducing a voltage according to the bias current; and
- a current limit transistor operated by a voltage difference between the bias voltage and the voltage reduced by the current limit resistor and controlling current flowing through the second temperature compensating transistor.

6. The amplifier of claim 5, wherein the bias voltage generating unit includes:
- a bias supply transistor having a collector connected to the operating voltage input terminal, a base connected to the collector of the first temperature compensating transistor, and an emitter connected to an output node of the bias voltage generating unit; and
- a capacitor connected between the base of the bias supply transistor and the ground.

7. The amplifier of claim 5, wherein the amplifying unit includes a power amplifier amplifying power of the high frequency signal.

8. An amplifier comprising:
- a control voltage generating unit generating a control voltage using a reference voltage;
- a bias voltage generating unit generating a bias voltage according to the control voltage;
- a bias current limit unit controlling the control voltage according to a bias current of the bias voltage generating unit; and
- an amplifying unit receiving the bias voltage from the bias voltage generating unit to amplify a high frequency signal, wherein the control voltage generating unit includes:
- a first temperature compensating transistor having a collector connected to a reference voltage input terminal via a first resistor, and an emitter and a base connected to a ground; and
- a second temperature compensating transistor having a collector connected to an operating voltage input terminal, a base connected to the collector of the first temperature compensating transistor, and an emitter connected to the ground via a second resistor, wherein the control voltage is provided from the collector of the first temperature compensating transistor, and wherein the bias current limit unit includes:
- a current limit resistor having one end connected to an output node of the bias voltage generating unit and the other end; and
- a current limit transistor having a collector connected to the emitter of the second temperature compensating transistor, a base connected to the other end of the current limit resistor, and an emitter connected to the ground.

9. The amplifier of claim 8, wherein the current limit transistor is operated by a voltage difference between the bias voltage and a voltage reduced by the current limit resistor to control current flowing through the second temperature compensating transistor.

* * * * *